(12) United States Patent
Sasaki et al.

(10) Patent No.: US 12,033,062 B2
(45) Date of Patent: Jul. 9, 2024

(54) RESERVOIR ELEMENT AND NEUROMORPHIC ELEMENT

(71) Applicant: TDK CORPORATION, Tokyo (JP)

(72) Inventors: Tomoyuki Sasaki, Tokyo (JP); Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 829 days.

(21) Appl. No.: 17/265,622

(22) PCT Filed: Nov. 21, 2018

(86) PCT No.: PCT/JP2018/042988
§ 371 (c)(1),
(2) Date: Feb. 3, 2021

(87) PCT Pub. No.: WO2020/105139
PCT Pub. Date: May 28, 2020

(65) Prior Publication Data
US 2021/0303981 A1    Sep. 30, 2021

(51) Int. Cl.
*H01L 27/22* (2006.01)
*G06N 3/063* (2023.01)
*G06N 3/08* (2023.01)
*H10B 61/00* (2023.01)
*H10N 50/85* (2023.01)
*H10N 52/01* (2023.01)

(52) U.S. Cl.
CPC .............. *G06N 3/063* (2013.01); *G06N 3/08* (2013.01); *H10B 61/00* (2023.02); *H10N 50/85* (2023.02); *H10N 52/01* (2023.02)

(58) Field of Classification Search
None
See application file for complete search history.

(56) References Cited

U.S. PATENT DOCUMENTS

2021/0303981 A1* 9/2021 Sasaki .................... H10N 59/00

OTHER PUBLICATIONS

Feb. 19, 2019 International Search Report issued in International Patent Application No. PCT/JP2018/042988.
(Continued)

*Primary Examiner* — Jack S Chen
(74) *Attorney, Agent, or Firm* — Oliff PLC

(57) ABSTRACT

A reservoir element includes a plurality of magnetoresistive effect elements each having a first ferromagnetic layer, a non-magnetic layer and a second ferromagnetic layer laminated in a first direction, and separated from each other, a spin orbit torque wiring that faces a part of at least one of the plurality of magnetoresistive effect elements, and a spin-conductive layer that connects at least the magnetoresistive effect elements closest to each other of the plurality of magnetoresistive effect elements, and conducts spins, wherein the magnetoresistive effect elements are seen from the first direction, the second ferromagnetic layer overlaps part of the first ferromagnetic layer, the spin orbit torque wiring faces a first portion that does not overlap the second ferromagnetic layer in the first ferromagnetic layer when seen from the first direction, and the spin-conductive layer faces at least the first ferromagnetic layer each of the closest magnetoresistive effect elements.

11 Claims, 9 Drawing Sheets

(56) References Cited

OTHER PUBLICATIONS

Jacob Torrejon et al., "Neuromorphic computing with nanoscale spintronic oscillators", Nature, vol. 547, pp. 428-432 (2017).
T. Sasaki et. al., "Electrical Spin Injection into Silicon Using MgO Tunnel Barrier", Applied Physics Express, vol. 2, (2009), 053003-1 to 053003-3.
T. Sasaki et. al., "Spin Transport in Nondegenerate Si with a Spin MOSFET Structure at Room Temperature", Physical Review Applied, vol. 2, 034005 (2014).
J. Slonczewski, "Current-driven excitation of magnetic multilayers", J. Magn. Magn. Mater., vol. 159, L1-L7, (1996).
M. Riou et al., "Neuromorphic Computing through Time-Multiplexing with a Spin-Torque Nano-Oscillator", IEDM17-804 (2017).
S. Tsunegi et. al., "Scaling up electrically synchronized spin torque oscillator networks", Scientific reports (2018), vol. 8, 13475.

* cited by examiner

RESERVOIR ELEMENT AND NEUROMORPHIC ELEMENT

TECHNICAL FIELD

The present invention relates to a reservoir element and a neuromorphic element.

BACKGROUND ART

A neuromorphic element is an element that imitates the human brain by a neural network. The neuromorphic element artificially imitates a relationship between a neuron and a synapse in the human brain.

A hierarchical type element is known as one type of neuromorphic element. A hierarchical type element has chips (neurons in the brain) disposed in a hierarchical form, and transmission means (synapses in the brain) configured to connect them. A hierarchical type element increases a percentage of correct answers to a question when the transmission means (synapses) perform learning. Learning is acquiring knowledge that can be used in the future from information, and the neuromorphic element weights the input data. The hierarchical type element performs learning in each hierarchy.

However, learning in each hierarchy becomes a heavy burden on circuit design and causes an increase in power consumption of a neuromorphic element when the number of chips (neurons) is increased. A reservoir computer is being studied as a way to reduce this burden.

A reservoir computer is one type of neuromorphic element. A reservoir computer includes a reservoir element and an output part. A reservoir element is constituted by a plurality of chips that interact with each other. The plurality of chips interact with each other according to input signals, and output signals. A transmission means that connects the plurality of chips has a fixed weight and does not perform learning. The output part learns signals from the reservoir element and outputs the signals to the outside. A reservoir computer enhances a percentage of correct answers to questions by compressing the data with the reservoir element and weighting the data in the output part. Learning in the reservoir computer is performed only in the output part. A reservoir computer is anticipated as means that can simplify the circuit design of neuromorphic elements and ameliorating power consumption.

Non-patent Literature 1 discloses a neuromorphic element using a spin torque oscillation (STO) element as a chip (neuron).

CITATION LIST

Non-Patent Literature

[Non-Patent Literature 1]
Jacob Torrejon et al., Nature, Vol. 547, pp. 428-432 (2017)

SUMMARY OF INVENTION

Technical Problem

However, in a neuromorphic element using STO elements in chips, it is necessary to align the resonance frequencies of the STO elements. The resonance frequency of an STO element varies due to manufacturing errors or the like, and STO elements may not interact with each other properly. In addition, an STO element is oscillated by applying a high-frequency current in a lamination direction. Applying a high-frequency current in the lamination direction of an STO element including an insulating layer for a long time may cause failure of the STO element.

In consideration of the above-mentioned circumstances, the present invention provides a reservoir element and a neuromorphic element that operate stably.

Solution to Problem

In order to solve the above-mentioned problems, the present invention provides the following means.

(1) A reservoir element according to a first aspect includes a plurality of magnetoresistive effect elements each having a first ferromagnetic layer, a non-magnetic layer and a second ferromagnetic layer laminated in a first direction, and separated from each other; a spin orbit torque wiring that faces a part of at least one of the plurality of magnetoresistive effect elements; and a spin-conductive layer that connects at least the magnetoresistive effect elements closest to each other of the plurality of magnetoresistive effect elements, and conducts spins, wherein, when the magnetoresistive effect elements are seen in plan view from the first direction, the second ferromagnetic layer overlaps a part of the first ferromagnetic layer, the spin orbit torque wiring faces a first portion that does not overlap the second ferromagnetic layer in the first ferromagnetic layer when seen in plan view from the first direction, and the spin-conductive layer faces at least the first ferromagnetic layers of the closest magnetoresistive effect elements.

(2) The reservoir element according to an aspect may further include a gate electrode facing the spin-conductive layer and disposed between the plurality of magnetoresistive effect elements.

(3) In the reservoir element according to the aspect, a plurality of spin orbit torque wirings may be provided, and each of the spin orbit torque wirings may be connected to each of the first ferromagnetic layers.

(4) In the reservoir element according to the aspect, the spin orbit torque wiring may be connected to two or more first ferromagnetic layers of the plurality of first ferromagnetic layers.

(5) In the reservoir element according to the aspect, the plurality of magnetoresistive effect elements may be disposed in a one-dimensional array on a first surface crossing the first direction.

(6) In the reservoir element according to the aspect, the plurality of magnetoresistive effect elements may be disposed in a two-dimensional array on a first surface crossing the first direction.

(7) In the reservoir element according to the aspect, the spin-conductive layer may form a lattice, and the magnetoresistive effect elements may face positions of intersections of the lattice of the spin-conductive layer.

(8) In the reservoir element according to the aspect, a plurality of spin-conductive layers may be provided, a first spin-conductive layer may face a first ferromagnetic layer of a magnetoresistive effect element disposed at a first height position in the first direction, a second spin-conductive layer may face a first ferromagnetic layer of a magnetoresistive effect element disposed at a second height position in the first direction, and the first spin-conductive layer and the second spin-conductive layer may be connected to each other by a spin via wiring that conducts spins.

(9) In the reservoir element according to the aspect, the spin-conductive layer may include any one metal or an alloy selected from the group consisting of Cu, Ag, Al, Mg, and Zn.

(10) In the reservoir element according to the aspect, the spin-conductive layer may include any one element or compound selected from the group consisting of Si, Ge, GaAs, and C.

(11) A neuromorphic element according to a second aspect includes the reservoir element according to the aspect; an input part connected to the reservoir element; and an output part connected to the reservoir element and configured to learn a signal from the reservoir element.

Advantageous Effects of Invention

A reservoir element and a neuromorphic element according to the embodiments can be stably operated.

DESCRIPTION OF EMBODIMENTS

Figure 1:
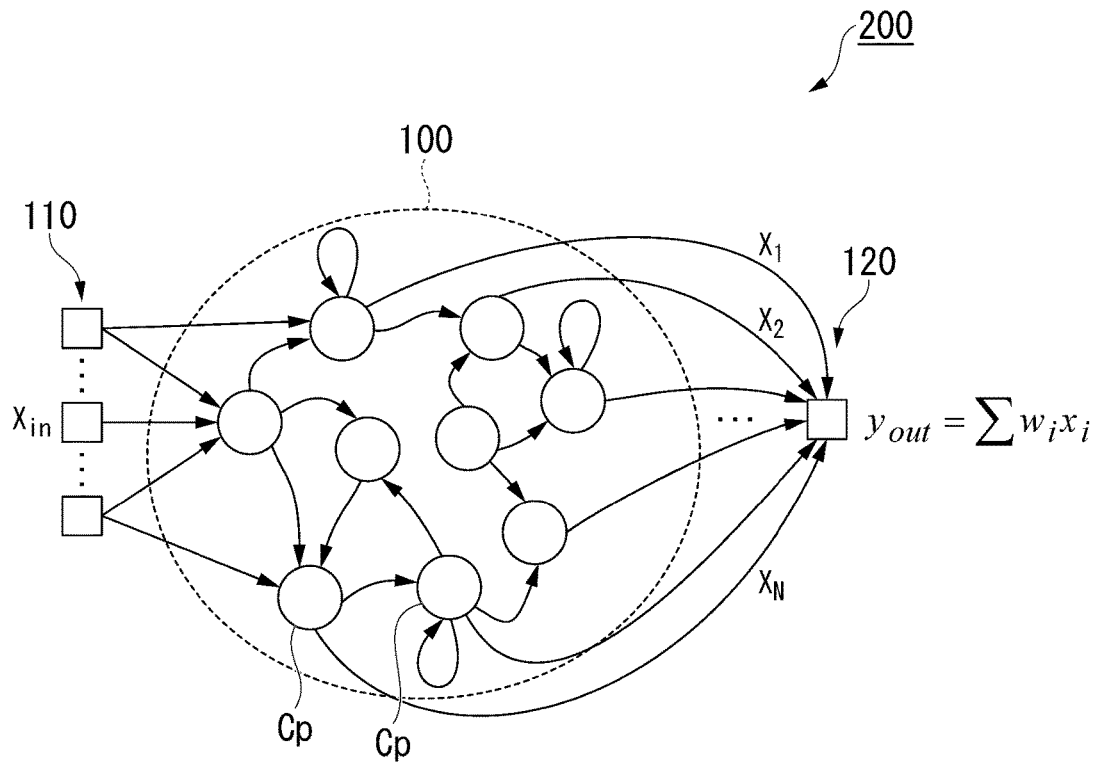
FIG. 1 is a conceptual view of a neuromorphic element according to a first embodiment.

Hereinafter, embodiments of the present invention will be described with reference to the accompanying drawings in detail. In the drawings used in the following description, feature portions may be enlarged for convenience to make features easier to understand, and dimensional ratios of components may be different from the actual ones. Materials, dimensions, and the like, exemplified in the following description are examples, and the present invention is not limited to them and may be appropriately modified and realized within a range in which the effects of the present invention are exhibited.

First Embodiment (Neuromorphic Element)

FIG. 1 is a conceptual view of a neuromorphic element according to a first embodiment. A neuromorphic element 200 has an input part 110, a reservoir element 100 and an output part 120. The input part 110 and the output part 120 are connected to the reservoir element 100.

The neuromorphic element 200 compresses the signal input from the input part 110 using the reservoir element 100, performs weighting (learning) in the output part 120 on the signal compressed, and outputs the signal to the outside.

The input part 110 transmits the signal input from the outside to the reservoir element 100. The input part 110 includes, for example, a plurality of sensors. The plurality of sensors detect information outside the neuromorphic element 200, and input the information to the reservoir element 100 as a signal. The signal may be continuously input to the reservoir element 100 over time according to a change in information in the outside, or may be divided by predetermined time-domain and input to the reservoir element 100.

The reservoir element 100 has a plurality of chips Cp. The plurality of chips Cp interact with each other. The signal input to the reservoir element 100 has a plurality of pieces of information. The plurality of pieces of information held by the signal is compressed into required information by interaction of the plurality of chips Cp. The compressed signal is transmitted to the output part 120. The reservoir element 100 does not perform learning. That is, the plurality of chips Cp only interact with each other, and the signals transmitted between the plurality of chips Cp are not weighted.

The output part 120 receives signals from the chips Cp of the reservoir element 100. The output part 120 performs learning. The output part 120 performs weighting according to the learning for the signal from each of the chips Cp. The output part 120 includes, for example, a non-volatile memory. The non-volatile memory is, for example, a magnetoresistive effect element. The output part 120 outputs the signal outside of the neuromorphic element 200.

The neuromorphic element 200 compresses data using the reservoir element 100, and enhances a percentage of correct answers of questions by weighting the data using the output part 120.

In addition, the neuromorphic element 200 has excellent power consumption. The learning in the neuromorphic element 200 is performed by only the output part 120. The learning is to adjust the weight of the signal transmitted from each of the chips Cp. The weight of the signal is determined according to an importance of the signal. When the weight of the signal is adjusted at any time, a circuit between the chips Cp becomes active. As the number of active circuits is increased, power consumption of the neuromorphic element 200 is increased. The neuromorphic element 200 only needs to learn the output part 120 in the final stage and has an excellent power consumption.

Figure 2:
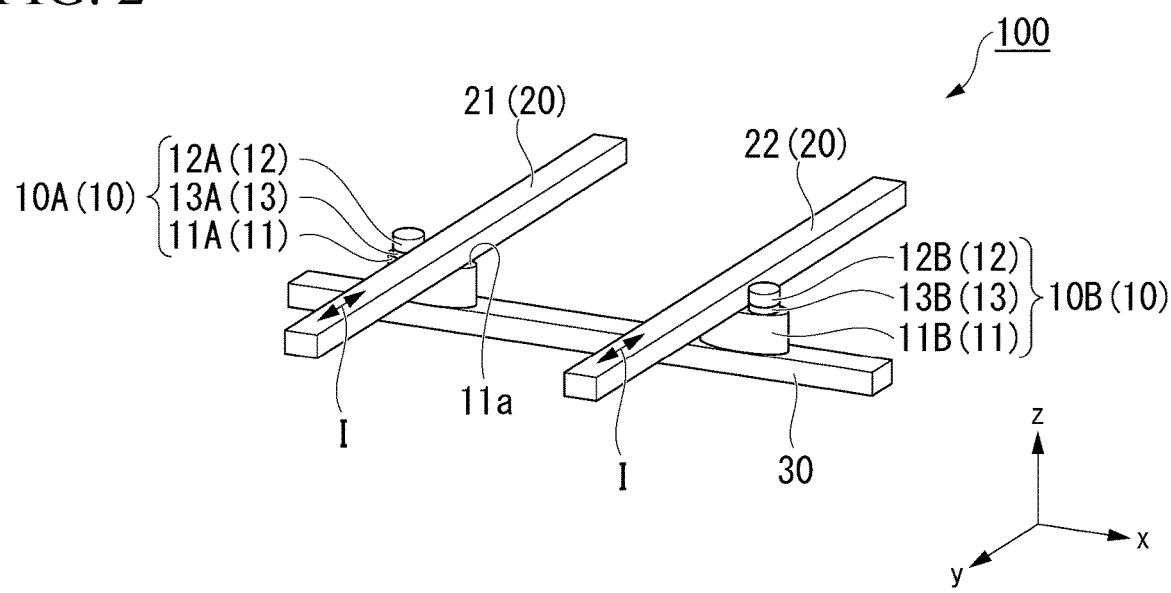
FIG. 2 is a perspective view of the reservoir element according to the first embodiment.

FIG. 2 is a perspective view of the reservoir element 100 according to the first embodiment.

First, directions will be defined. A direction in which layers of magnetoresistive effect elements 10 (to be described below) are laminated is referred to as a z-direction, a direction of a surface perpendicular to the z-direction is referred to as an x-direction, and a direction perpendicular to the z-direction and the x-direction is referred to as the y-direction. The z-direction is an example of a first direction. An x-y plane is an example of a first surface.

(Reservoir Element)

The reservoir element 100 includes a plurality of magnetoresistive effect elements 10, a spin orbit torque wiring 20 and a spin-conductive layer 30. The magnetoresistive effect elements 10 shown in FIG. 2 correspond to the chips Cp shown in FIG. 1. The spin-conductive layer 30 shown in FIG. 2 corresponds to a transmission means that connects the chips Cp in FIG. 1.

"Magnetoresistance Effect Element"

The reservoir element 100 has the plurality of magnetoresistive effect elements 10. For example, the reservoir element 100 has a first magnetoresistive effect element 10A and a second magnetoresistive effect element 10B. Hereinafter, when the first magnetoresistive effect element 10A and the second magnetoresistive effect element 10B are not distinguished from each other, they may be simply referred to as the magnetoresistive effect elements 10.

The first magnetoresistive effect element 10A and the second magnetoresistive effect element 10B are separated from each other. Neighboring magnetoresistive effect elements 10 are insulated by, for example, an interlayer insulating film. The first magnetoresistive effect element 10A and the second magnetoresistive effect element 10B are arranged one-dimensionally in the x-direction. In the specification, "arranged one-dimensionally" means that the magnetoresistive effect elements 10 are arranged in one direction and lines connecting the magnetoresistive effect elements 10 are aligned in one direction (for example in the x-direction).

Each of the magnetoresistive effect elements 10 has a first ferromagnetic layer 11, a non-magnetic layer 13 and a second ferromagnetic layer 12. The first magnetoresistive effect element 10A has, for example, a first ferromagnetic layer 11A, a non-magnetic layer 13A and a second ferromagnetic layer 12A. The second magnetoresistive effect element 10B has, for example, a first ferromagnetic layer 11B, a non-magnetic layer 13B and a second ferromagnetic layer 12B. Hereinafter, when the first ferromagnetic layers 11A and 11B are not distinguished from each other, they may be referred to as the first ferromagnetic layers 11, when the second ferromagnetic layers 12A and 12B are not distinguished from each other, they may be referred to as the second ferromagnetic layers 12, and when the non-magnetic layers 13A and 13B are not distinguished from each other, they may be referred to as the non-magnetic layer 13.

The magnetoresistive effect element 10 has the same configuration as a tunneling magnetoresistive (TMR) element when the non-magnetic layer 13 is formed of an insulating substance, and has the same configuration as a great magnetoresistive (GMR) element when the non-magnetic layer 13 is formed of a metal or a semiconductor.

The magnetoresistive effect elements 10 are laminated in a sequence of the first ferromagnetic layer 11, the non-magnetic layer 13 and the second ferromagnetic layer 12 from a position close to the spin-conductive layer 30.

The first ferromagnetic layer 11 and the second ferromagnetic layer 12 include ferromagnetic bodies. The first ferromagnetic layer 11 and the second ferromagnetic layer 12 include, for example, a metal selected from the group consisting of Cr, Mn, Co, Fe and Ni, alloys including one or more of these metals, or alloys including at least one element of these metals, B, C, and N. The first ferromagnetic layer 11 and the second ferromagnetic layer 12 are, for example, Co—Fe, Co—Fe—B, Ni—Fe, a Co—Ho alloy (CoHo$_2$), and a Sm—Fe alloy (SmFe$_{12}$).

The first ferromagnetic layer 11 and the second ferromagnetic layer 12 have magnetization. The magnetization may be vertically oriented in the z-direction or may be oriented in a surface oriented in a direction in the x-y plane. The magnetization of the first ferromagnetic layer 11 is oscillated by spins supplied from the spin orbit torque wiring 20.

The magnetization of the second ferromagnetic layer 12 is relatively fixed with respect to the magnetization of the first ferromagnetic layer 11. The magnetization of the second ferromagnetic layer 12 is relatively fixed with respect to the magnetization of the first ferromagnetic layer 11 by, for example, making a coercive force of the second ferromagnetic layer 12 larger than a coercive force of the first ferromagnetic layer 11.

The non-magnetic layer 13 is formed of a non-magnetic insulating substance, a semiconductor or a metal. The non-magnetic insulating substance is, for example, Al$_2$O$_3$, SiO$_2$, MgO and MgAl$_2$O$_4$, and a material obtained by substituting some of Al, Si and Mg of these with Zn, Be, or the like. When the non-magnetic layer 13 is formed of an insulating substance, the non-magnetic layer 13 is a tunnel barrier layer. MgO or MgAl$_2$O$_4$ can easily realize a coherent tunnel between the first ferromagnetic layer 11 and the second ferromagnetic layer 12. The non-magnetic metal is, for example, Cu, Au, Ag, or the like. Further, the non-magnetic semiconductor is, for example, Si, Ge, CuInSe$_2$, CuGaSe$_2$, Cu(In, Ga)Se$_2$, or the like.

An area of the first ferromagnetic layer 11 is larger than that of the second ferromagnetic layer 12 when seen in plan view from the z-direction. The second ferromagnetic layer 12 overlaps a part of the first ferromagnetic layer 11 when seen in plan view from the z-direction. The second ferromagnetic layer 12 overlaps the first ferromagnetic layer 11 in the portion that does not overlap the spin orbit torque wiring 20, which will be described below, when seen in plan view from the z-direction.

The area of the non-magnetic layer 13 may be smaller than that of the first ferromagnetic layer 11 or may be substantially the same as the area of the first ferromagnetic layer 11 when seen in plan view from the z-direction. When the area of the non-magnetic layer 13 is substantially the same as that of the first ferromagnetic layer 11, a part of the non-magnetic layer 13 is disposed between the spin orbit torque wiring and the first ferromagnetic layer 11, which will be described below. The area of the non-magnetic layer 13 is preferably substantially the same as that of the second ferromagnetic layer 12 in order not to inhibit moving of spins between the spin orbit torque wiring 20 and the first ferromagnetic layer 11, which will be described below.

The magnetoresistive effect element 10 may have a layer other than the first ferromagnetic layer 11, the second ferromagnetic layer 12 and the non-magnetic layer 13. For example, a wiring (not shown) configured to output the signal to the output part 120 may be connected to a side of the second ferromagnetic layer 12 opposite to the non-magnetic layer 13.

"Spin Orbit Torque Wiring"

The reservoir element 100 has the spin orbit torque wiring 20. The reservoir element 100 has, for example, a first spin orbit torque wiring 21 and a second spin orbit torque wiring 22 (see FIG. 2). Hereinafter, when the first spin orbit torque wiring 21 and the second spin orbit torque wiring 22 are not distinguished from each other, they may be simply referred to as the spin orbit torque wiring 20.

The spin orbit torque wiring 20 faces a part of at least one of the plurality of magnetoresistive effect elements 10. For example, the spin orbit torque wiring 20 faces a first portion 11a that does not overlap the second ferromagnetic layer 12 in the first ferromagnetic layer 11 of the magnetoresistive effect element 10 when seen in plan view from the z-direction. In the specification, "facing" is not limited to the case in which the members are in contact with each other and includes the case in which the two members are present in different layers.

The first spin orbit torque wiring 21 is connected to the first ferromagnetic layer 11A and the second spin orbit torque wiring 22 is connected to the first ferromagnetic layer 11B. In the specification, "connected" means that the spins are connected in a conductible state. For example, even when a layer is provided between the first ferromagnetic layer 11 and the spin orbit torque wiring 20, delivery and acceptance of the spins between the first ferromagnetic layer 11 and the spin orbit torque wiring 20 may be possible.

The spin orbit torque wiring 20 extends in a direction crossing the lamination direction (the z-direction) of the first ferromagnetic layer 11. For example, the first spin orbit torque wiring 21 and the second spin orbit torque wiring 22 extend in the y-direction.

The spin orbit torque wiring 20 produces spin currents using a spin Hall effect when a current I flows. The spin Hall effect is a phenomenon in which the spin currents are induced in a direction perpendicular to a flow direction of the current I based on the spin orbit interaction when the current I flows.

When a potential difference is provided between both ends of the spin orbit torque wiring 20, the current I flows along the spin orbit torque wiring 20. A first spin oriented in one direction and a second spin oriented in a direction opposite to the first spin are bent in a direction perpendicular to the current. For example, the first spin oriented in the −x-direction may be bent in the −z-direction, and the second spin oriented in the +x-direction is curved in the +z-direction.

A conventional Hall effect and a spin Hall effect are the same in that moving (moving) charges (electrons) are curved in a motion (moving) direction. Meanwhile, in the normal Hall effect, the charged particles moving in the magnetic field receive a Lorentz force and the motion direction is curved, whereas in the spin Hall effect, the major difference is that the moving direction of the spins is bent due to movement of electrons (due to a current flowing) in the absence of a magnetic field.

In the non-magnetic body, the number of electrons of the first spin and the electron number of the second spin generated by the spin Hall effect are equal to each other. The electron number of the first spin oriented in the −z-direction is equal to the electron number of the second spin oriented in the +z-direction. In this case, flows of the charges cancel each other out, and the amount of current becomes zero. The spin currents without the electric current are particularly referred to as pure spin currents. Provided that a flow of the electrons of the first spin is expressed as $J_\uparrow$, a flow of the electrons of the second spin is expressed as $J_\downarrow$, and the spin current is expressed as $J_S$, $J_S = J_\uparrow - J_\downarrow$ is defined. The spin current $J_S$ is generated in the z-direction.

The spin orbit torque wiring 20 faces the first portion 11a of the first ferromagnetic layer 11. The spins are injected into the first ferromagnetic layer 11 from the spin orbit torque wiring 20. The injected spins provide a spin orbit torque (SOT) to the magnetization of the first ferromagnetic layer 11. The magnetization of the first ferromagnetic layer 11 is oscillated by the spin orbit torque (SOT). The magnetization of the first ferromagnetic layer 11A is oscillated by receiving the spin orbit torque (SOT) due to the spins injected from the first spin orbit torque wiring 21. The magnetization of the first ferromagnetic layer 11B is oscillated by receiving the spin orbit torque (SOT) due to the spins injected from the second spin orbit torque wiring 22.

The spin orbit torque wiring 20 is formed of any one of a metal, an alloy, an intermetallic compound, a metal boride, a metal carbide, a metal silicide, and a metal phosphide having a function of generating spin currents using the spin Hall effect when a current flows.

The spin orbit torque wiring 20 is preferably mainly composed of a non-magnetic heavy metal. A heavy metal means a metal having a specific gravity equal to or more than that of yttrium. The non-magnetic heavy metal is preferably a non-magnetic metal having a larger atomic number equal to or greater than 39, which is an atomic number of a metal having d electrons or f electrons in the outermost shell. The non-magnetic heavy metal has a large spin orbit interaction that causes a spin Hall effect.

Electrons generally move in a direction opposite to a current regardless of the direction of the spins. On the other hand, a non-magnetic metal with a large atomic number having d electrons or f electrons in the outermost shell has a large spin orbit interaction, and the spin Hall effect is strongly generated. A flow of spins in the z-direction depends on a degree of uneven distribution of the spins in the z-direction.

When the spin Hall effect is strongly generated, the spins are likely to be unevenly distributed, and the spin current $J_S$ is likely to occur.

In addition, the spin orbit torque wiring 20 may include a magnetic metal. The magnetic metal is a ferromagnetic metal or an anti-ferromagnetic metal. A small amount of magnetic metal contained in the non-magnetic body becomes a cause of scattering of spins. When spins are scattered, the spin orbit interaction is enhanced, and the efficiency of generation of the spin current with respect to the current is increased.

Meanwhile, when a dosage of the magnetic metal is excessively increased, the generated spin currents are scattered by the added magnetic metal, and as a result, the spin currents may be reduced. A molar ratio of the added magnetic metal is preferably sufficiently smaller than a total of the molar ratios of the elements that constitute the spin orbit torque wiring. The molar ratio of the added magnetic metal is preferably equal to or smaller than 3% of the entirety.

The spin orbit torque wiring 20 may include a topological insulating substance. A topological insulating substance is a material in which the inside of the material is an insulating substance or a high-resistance substance but a spin-polarized metal state occurs on the surface thereof. In the topological insulating substance, an internal magnetic field is generated due to the spin orbit interaction. In the topological insulating substance, even when an external magnetic field is not provided, a new topological phase appears due to an effect of the spin orbit interaction. The topological insulating substance can generate pure spin currents with high efficiency due to strong spin orbit interaction and breaking of inversion symmetry at an edge thereof.

The topological insulating substance is, for example, SnTe, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$, or the like. The topological insulating substance can generate the spin currents with high efficiency.

"Spin-Conductive Layer"

The spin-conductive layer 30 faces at least the two first ferromagnetic layers 11 that are closest to each other. The spin-conductive layer 30 connects, for example, the first magnetoresistive effect element 10A and the second magnetoresistive effect element 10B. More specifically, the spin-conductive layer 30 connects, for example, the two first ferromagnetic layers 11A and 11B. The first magnetoresistive effect element 10A and the second magnetoresistive effect element 10B are arranged one-dimensionally in the x-direction, and the spin-conductive layer 30 that connects them extends in the x-direction.

The spin-conductive layer 30 is formed of a non-magnetic conductor. The spin-conductive layer 30 propagates the spin currents extruded from the first ferromagnetic layers 11A and 11B.

The spin-conductive layer 30 is formed of, for example, a material having a large spin diffusion length and a large spin transportation length. The spin diffusion length is a distance until the spins injected into the spin-conductive layer 30 are diffused and information of the injected spins is halved. The spin transportation length is a distance until the spin currents of the spin polarization current flowing through the non-magnetic body are halved. When a palpation voltage to the spin-conductive layer 30 is small, the spin diffusion length and the spin transportation length substantially coincide with each other. Meanwhile, when the application voltage to the spin-conductive layer 30 is increased, a spin transportation length due to a drift effect is greater than the spin diffusion length.

The spin-conductive layer 30 connects at least the two first ferromagnetic layers 11A and 11B that are closest to each other. A distance between the two neighboring first ferromagnetic layers 11A and 11B is preferably equal to or smaller than a spin transportation length of a material that constitutes the spin-conductive layer 30, or more preferably equal to or smaller than the spin diffusion length.

The spin-conductive layer 30 is, for example, a metal or a semiconductor. The metal used in the spin-conductive layer 2 is, for example, a metal or an alloy containing any element selected from the group consisting of Cu, Ag, Al, Mg and Zn. The semiconductor used in the spin-conductive layer 30 is, for example, a simple substance or an alloy of any element selected from the group consisting of Si, Ge, GaAs and C. For example, Si, Ge, Si—Ge compound, GaAs, grapheme, or the like, is exemplified.

(Method of Manufacturing Reservoir Element)

Next, an example of a method of manufacturing the reservoir element 100 in the neuromorphic element 200 will be described. The reservoir element 100 can be fabricated by combining a film-forming method such as sputtering or the like, and a processing method such as photolithography or the like.

First, a substrate (not shown) is prepared. The substrate is, for example, a semiconductor substrate. A substrate Sb is preferably, for example, Si or AlTiC. It is easy to obtain a surface with excellent flatness using Si or AlTiC.

Next, the spin-conductive layer 30 and the first ferromagnetic layer 11 are laminated on a surface of the substrate. The spin-conductive layer 30 and the first ferromagnetic layer 11 are laminated using, for example, a sputtering method or a chemical vapor deposition (CVD) method.

Next, a hard mask is formed at a predetermined position on a surface of the first ferromagnetic layer 11. Then, a portion that is not coated with the hard mask is removed through RIE or ion milling. The spin-conductive layer 30 and the first ferromagnetic layer 11 are processed in a predetermined shape by changing a processing direction. Next, surroundings of the spin-conductive layer 30 and the first ferromagnetic layer 11 are coated with an interlayer insulating film.

Next, surfaces of the first ferromagnetic layer 11 and the interlayer insulating film are flattened through chemical mechanical polishing (CMP). The non-magnetic layer 13 and the second ferromagnetic layer 12 are sequentially laminated on the first ferromagnetic layer 11 and interlayer insulating film that are flattened. The non-magnetic layer 13 and the second ferromagnetic layer 12 that are laminated are removed when seen in plan view from the z-direction, leaving a part of the position overlapping the first ferromagnetic layer 11.

Next, the spin orbit torque wiring 20 is laminated. The spin orbit torque wiring 20 is laminated through, for example, a sputtering method or a chemical vapor deposition (CVD) method. The spin orbit torque wiring 20 is processed in a predetermined shape through photolithography or the like. The spin orbit torque wiring 20 is formed on the first portion 11a of the first ferromagnetic layer 11 when seen in plan view from the z-direction. The reservoir element 100 according to the first embodiment is obtained in such a sequence.

(Operation of Reservoir Element)

Next, a function of the reservoir element 100 will be described. A sensor that constitutes the input part 110 is connected to any one of the spin orbit torque wirings 20. When the sensor receives a signal from the outside, and the current I flows to the corresponding spin orbit torque wiring 20.

Figure 3:
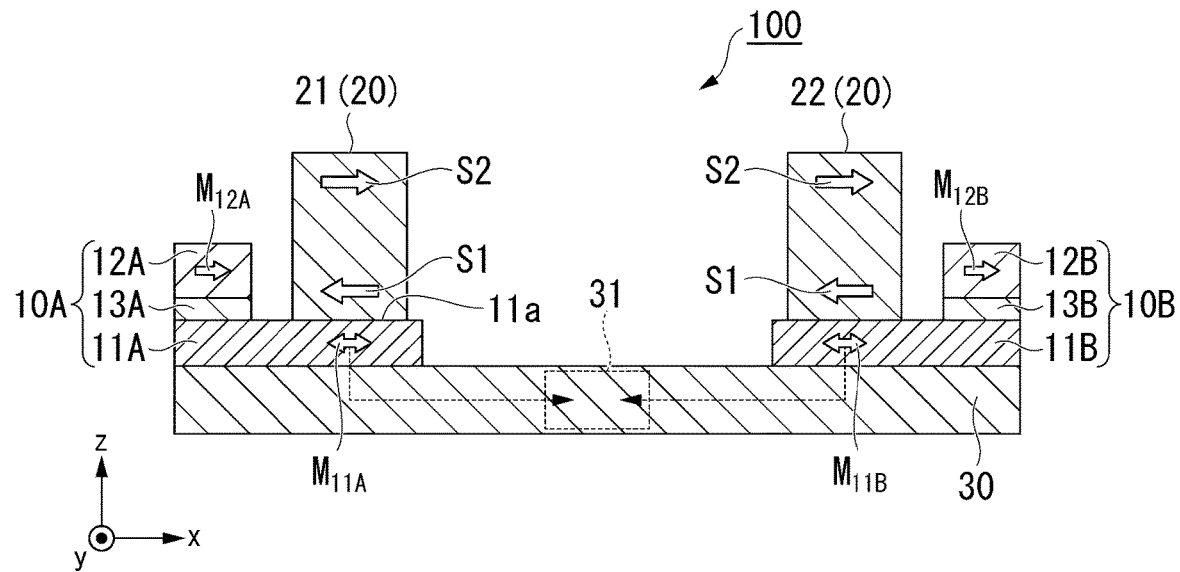
FIG. 3 is a view describing an operation of the reservoir element according to the first embodiment.

FIG. 3 is a view describing an operation of the reservoir element 100. When the current I flows to the spin orbit torque wiring 20, a first spin Si and a second spin S2 move in the z-direction due to the spin Hall effect. For example, the first spin S1 moves in the −z-direction, and the second spin S2 moves in the +z-direction. The first spin S1 accumulated on an interface between the first ferromagnetic layer 11 and the spin orbit torque wiring 20 is injected into the first ferromagnetic layer 11, and a spin orbit torque is applied to magnetizations $M_{11A}$ and $M_{11B}$ of the first ferromagnetic layers 11A and 11B.

The direction (the +z-direction or the −z-direction) in which the first spin S1 and the second spin S2 move is changed according to an orientation of the current I flowing through the spin orbit torque wiring 20. When the high-frequency current is applied to the spin orbit torque wiring 20, the orientation of the spins injected into the first ferromagnetic layer 11 is changed, and the magnetizations $M_{11A}$ and $M_{11B}$ of the first ferromagnetic layers 11A and 11B are oscillated. In addition, the magnetizations $M_{11}$ and $M_{12}$ can be oscillated by adjusting the current flowing through the spin orbit torque wiring 20.

The spin currents reach the spin-conductive layer 30 from the first ferromagnetic layers 11A and 11B. Since the magnetizations $M_{11A}$ and $M_{11B}$ are oscillated, the spin currents also show oscillation corresponding to the magnetizations $M_{11}$ and $M_{12}$. The spins accumulated on the interface between the first ferromagnetic layers 11A and 11B and the spin-conductive layer 30 propagate in the spin-conductive layer 30 as the spin currents.

The spin current from which the magnetization $M_{11A}$ of the first ferromagnetic layer 11A is created and the spin current from which the magnetization $M_{11B}$ of the first ferromagnetic layer 11B is created interfere with each other in a merging region 31 in the spin-conductive layer 30. The merging region 31 is disposed between the first ferromagnetic layers 11A and 11B and in the spin-conductive layer 30 when seen in plan view from the z-direction. The interference between the spin currents affects the oscillations of the magnetizations $M_{11A}$ and $M_{11B}$, and the oscillations of the magnetizations $M_{11A}$ and $M_{11B}$ of the first ferromagnetic layers 11A and 11B resonate with each other. A frequency of the oscillation of the magnetization $M_{11A}$ and a frequency of the oscillation of the magnetization $M_{11B}$ coincide with each other due to the resonance. A phase of the oscillation of the magnetization $M_{11A}$ and a phase of the oscillation of the magnetization $M_{11B}$ are synchronized with each other or are deviated from each other by a half-wave length ($\pi$).

Figure 4:
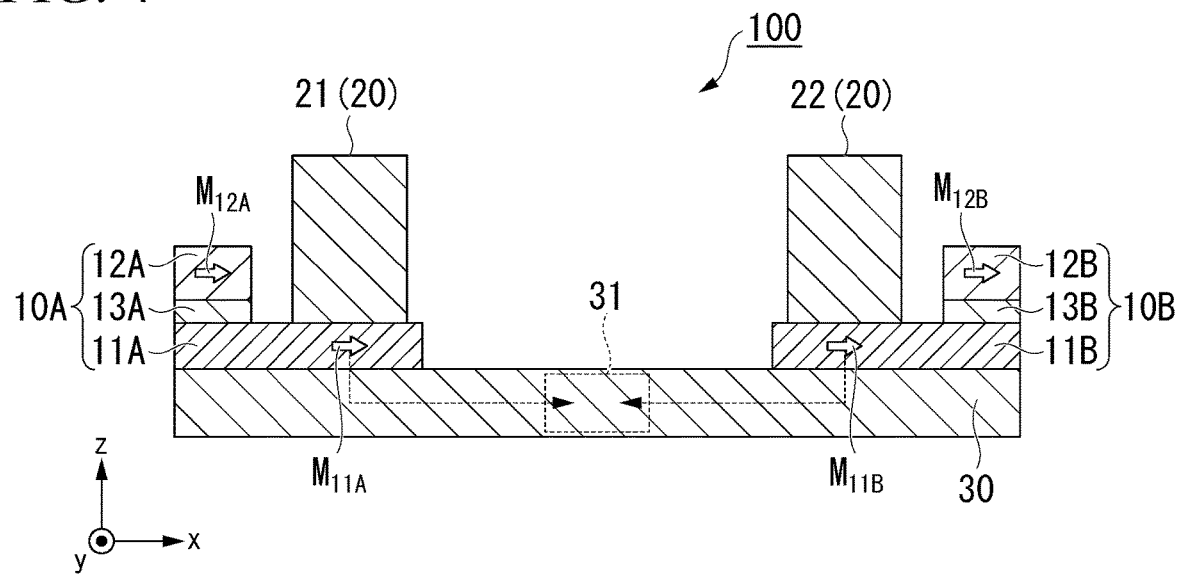
FIG. 4 is a view showing a relationship of magnetization when two phases of oscillation of the magnetization are synchronized.
Figure 5:
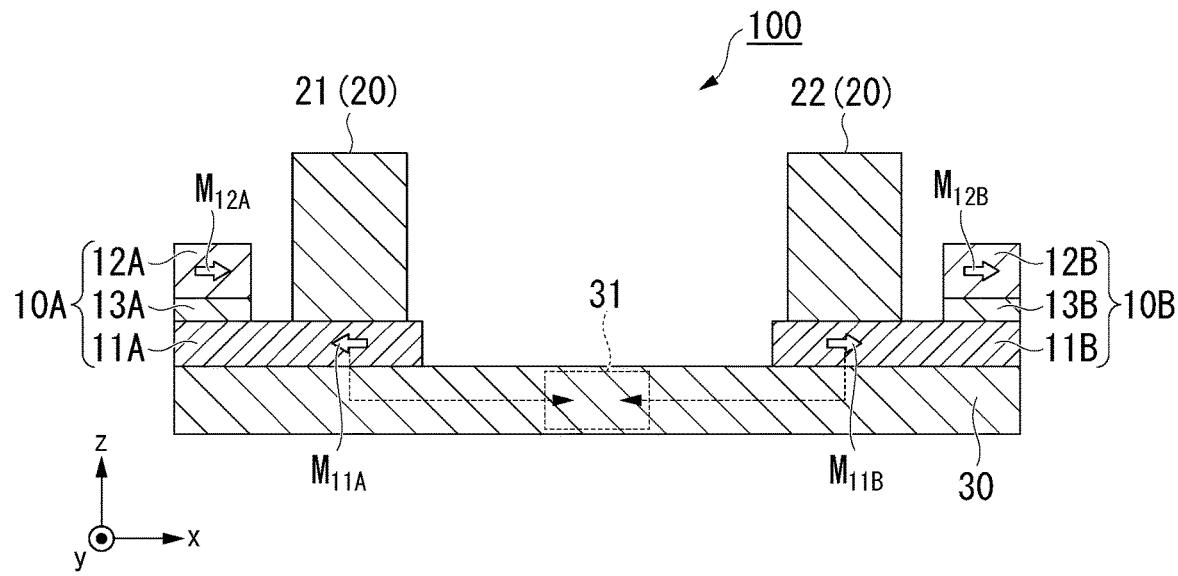
FIG. 5 is a view showing a relationship of magnetization when the two phases of the oscillation of the magnetization deviate from each other by a half-wave length ($\pi$).

When application of the current I to the spin orbit torque wiring 20 is stopped, the oscillation of the magnetizations $M_{11A}$ and $M_{11B}$ is stopped. FIGS. 4 and 5 show a relationship between the magnetizations $M_{11A}$ and $M_{11B}$ after resonance. FIG. 4 shows a relationship between the magnetizations $M_{11A}$ and $M_{11B}$ when the phases of the oscillations of the two magnetizations $M_{11A}$ and $M_{11B}$ are synchronized with each other. When the phases of the oscillations of the two magnetizations $M_{11A}$ and $M_{11B}$ are synchronized with each other, the orientation of the magnetization $M_{11A}$ and the orientation of the magnetization $M_{11B}$ are aligned (hereinafter, referred to "parallel"). On the other hand, FIG. 5 shows a relationship between the magnetizations $M_{11A}$ and $M_{11B}$ when the phases of the oscillations of the two magnetizations $M_{11A}$ and $M_{11B}$ are deviated from each other by a half-wave length ($\pi$). When the phases of the two oscillations are deviated from each other by a half-wave length ($\pi$), the orientation of the magnetization $M_{11A}$ and the orientation of the magnetization $M_{11B}$ are opposite (hereinafter, referred to as "anti-parallel").

Next, a signal is output from the reservoir element 100 to the output part 120. The signal is output as a resistance value of each of the magnetoresistive effect elements 10. The resistance value of the magnetoresistive effect element 10 is a resistance value in the z-direction, and a resistance value when direct current flows in sequence of the spin orbit torque wiring 20, the first ferromagnetic layer 11, the non-magnetic layer 13 and the second ferromagnetic layer 12. The resistance value of the magnetoresistive effect element 10 is changed according to an orientation direction of the magnetization of the two ferromagnetic layers (the first ferromagnetic layer 11 and the second ferromagnetic layer 12) with the non-magnetic layer 13 sandwiched therebetween.

For example, the resistance value of the first magnetoresistive effect element 10A when the magnetization $M_{11A}$ of the first ferromagnetic layer 11A and the magnetization $M_{12A}$ of the second ferromagnetic layer 12A are parallel to each other is smaller than that when the magnetization $M_{11A}$ and the magnetization $M_{12A}$ are anti-parallel to each other. The first magnetoresistive effect element 10A transmits, for example, information of "1" when the resistance value of the first magnetoresistive effect element 10A is large (when the magnetization $M_{11A}$ and the magnetization $M_{12A}$ are anti-parallel to each other) and "0" when small (when the magnetization $M_{11A}$ and the magnetization $M_{12A}$ are parallel to each other) to the output part 120. Like the second magnetoresistive effect element 10B, for example, information of "1" when the magnetization $M_{11B}$ and the magnetization $M_{12B}$ are anti-parallel to each other and "0" when the magnetization $M_{11B}$ and the magnetization $M_{12B}$ are parallel to each other is transmitted to the output part 120.

The current I input to the spin orbit torque wiring 20 has various pieces of information, which are, for example, a frequency, a current density, an amperage, and the like, of the current I. Meanwhile, the reservoir element 100 outputs the information of "1" and "0" as the resistance values of the magnetoresistive effect elements 10. That is, the reservoir element 100 according to the first embodiment compresses the information by converting the oscillations of the magnetizations $M_{11A}$ and $M_{11B}$ of the plurality of first ferromagnetic layers 11 into the spin currents and interfering with each other in the spin-conductive layer 30.

The compressed signal is transmitted to the output part 120. The output part 120 weights the signal read from the reservoir element 100 through learning.

As described above, the reservoir element 100 according to the first embodiment compresses the information by converting the oscillations of the magnetization $M_{11A}$ and $M_{11B}$ of the plurality of first ferromagnetic layers 11 into the spin currents and the spin currents interfere with each other in the spin-conductive layer 30. When the signals are compressed by the reservoir element 100, only the output part 120 needs to be learned, and the power consumption of the neuromorphic element 200 is reduced.

Second Embodiment

Figure 6:
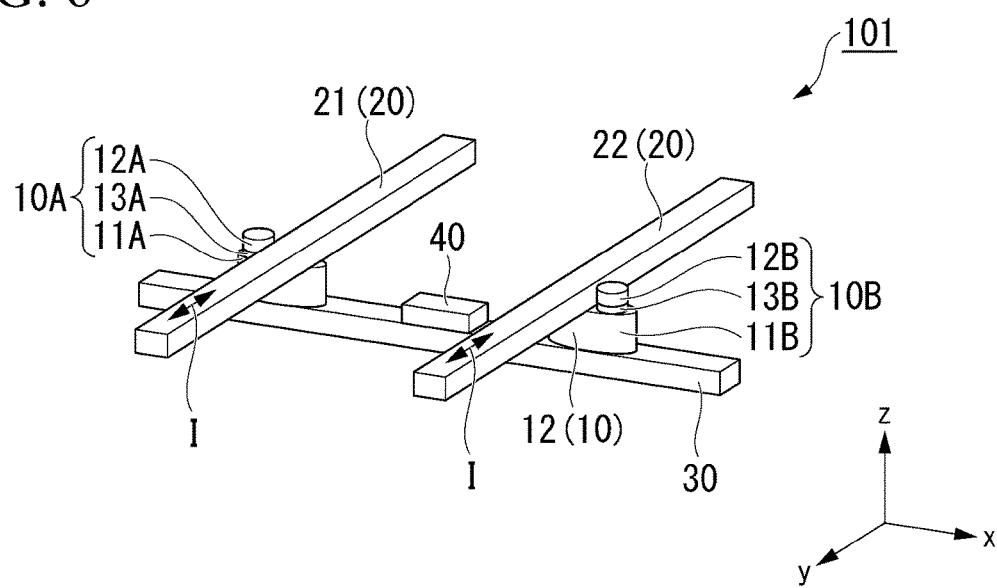
FIG. 6 is a perspective view of a reservoir element according to a second embodiment.

FIG. 6 is a perspective view of a reservoir element 101 according to a second embodiment. The reservoir element 101 is distinguished from the reservoir element 100 shown in FIG. 2 in that a gate electrode 40 is provided. The other configurations are the same as in the first embodiment and designated by the same reference signs. Description of the Same Configurations Will be Omitted.

The gate electrode 40 faces the spin-conductive layer 30. The gate electrode 40 is disposed between the first magnetoresistive effect element 10A and the second magnetoresistive effect element 10B when seen in plan view from the z-direction.

The gate electrode 40 includes a known electrode material. When the spin-conductive layer 30 is formed of a metal or an alloy, an insulating layer is preferably provided between the gate electrode 40 and the spin-conductive layer 30.

The gate electrode 40 applies a voltage to the spin-conductive layer 30. When the voltage is applied to the gate electrode 40, the ease of conduction of the spins in the spin-conductive layer 30 is changed. For this reason, an interference condition between the spin current from which the magnetization $M_{11A}$ of the first ferromagnetic layer 11A is created and the spin current from which the magnetization $M_{11B}$ of the first ferromagnetic layer 11B is created (for example, a position at which the spin currents interfere with each other (a position of the merging region 31) or the like) is changed. When the interference condition between the spin currents is changed, a probability that the phase of the oscillation of the magnetization $M_{11A}$ and the phase of the oscillation of the magnetization $M_{11B}$ are synchronized with each other and a probability that they are deviated from each other by a half-wave length ($\pi$) are fluctuated. That is, the gate electrode 40 can change a compression condition of information in the reservoir element 100.

As described above, the reservoir element 101 according to the second embodiment can compress the information by converting the oscillations of the magnetizations $M_{11A}$ and $M_{11B}$ of the plurality of first ferromagnetic layers 11 into the spin currents, and causing the spin currents to interfere with each other in the spin-conductive layer 30. In addition, the compression condition of the information can be changed by the gate electrode 40.

Third Embodiment

Figure 7:
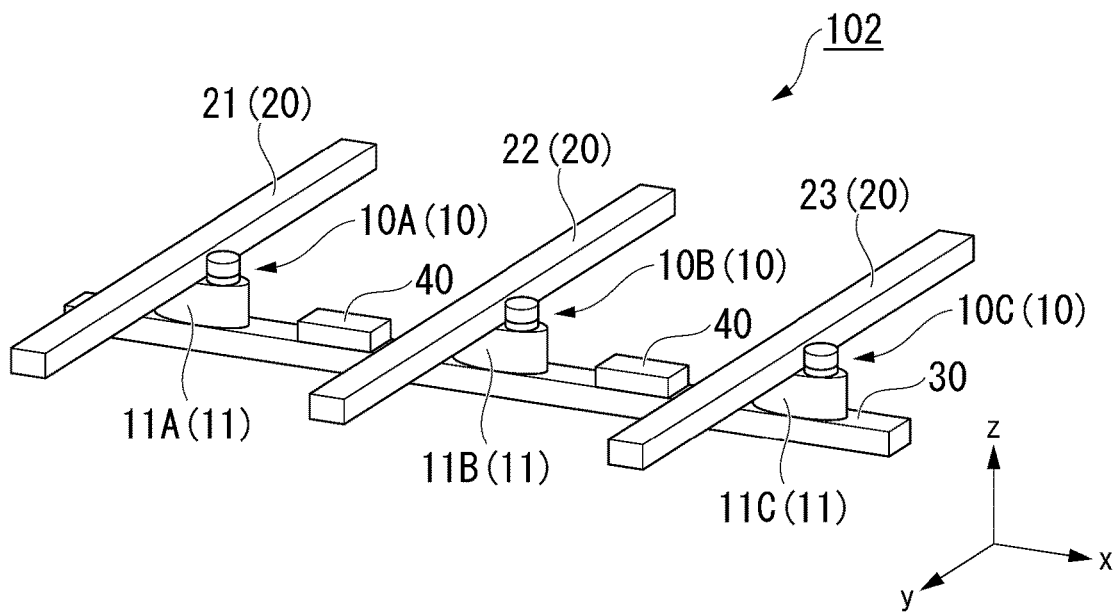
FIG. 7 is a perspective view of a reservoir element according to a third embodiment.

FIG. 7 is a perspective view of a reservoir element 102 according to a third embodiment. The reservoir element 102 is distinguished from the reservoir element 101 according to the second embodiment in that the number of magnetoresistive effect elements 10 and the number of spin orbit torque wirings 20 are different from those in the second embodiment. The other configurations are the same as in the second embodiment and designated by the same reference signs. Description of the same configurations will be omitted.

The reservoir element 102 has the plurality of magnetoresistive effect elements 10, the plurality of spin orbit torque wirings 20, the spin-conductive layer 30, and the plurality of gate electrodes 40.

The plurality of magnetoresistive effect elements 10 are, for example, a first magnetoresistive effect element 10A, a second magnetoresistive effect element 10B, and a third magnetoresistive effect element 10C. The first magnetoresistive effect element 10A, the second magnetoresistive effect element 10B and the third magnetoresistive effect element 10C are arranged one-dimensionally in the x-direction.

The plurality of spin orbit torque wirings 20 includes, for example, a first spin orbit torque wiring 21, a second spin orbit torque wiring 22 and a third spin orbit torque wiring 23. The plurality of spin orbit torque wirings 20 are provided on each of the plurality of magnetoresistive effect elements 10. That is, the first spin orbit torque wiring 21 faces the first ferromagnetic layer 11A, the second spin orbit torque wiring 22 faces the first ferromagnetic layer 11B, and the third spin orbit torque wiring 23 faces the first ferromagnetic layer 11C.

The spin-conductive layer 30 extends in the x-direction. The spin-conductive layer 30 faces the plurality of first ferromagnetic layers 11. The spin-conductive layer connects the first ferromagnetic layers 11A, 11B and 11C.

The gate electrode 40 faces the spin-conductive layer 30. The gate electrode is disposed between the first ferromagnetic layers 11A and 11B and between the first ferromagnetic layers 11B and 11C when seen in plan view from the z-direction.

The oscillation of the magnetization of the first ferromagnetic layer 11A and the oscillation of the magnetization of the first ferromagnetic layer 11B are converted into the spin currents and interfere with each other in the spin-conductive layer 30. The oscillation of the magnetization of the first ferromagnetic layer 11B and the oscillation of the magnetization of the first ferromagnetic layer 11C are converted into the spin currents and interfere with each other in the spin-conductive layer 30. In addition, when a distance between the first ferromagnetic layer 11A and the first ferromagnetic layer 11C is short, the oscillation of the magnetization of the first ferromagnetic layer 11A and the oscillation of the magnetization of the first ferromagnetic layer 11C are converted into the spin currents and interfere with each other in the spin-conductive layer 30.

For example, the phase of the oscillation of magnetization of the first ferromagnetic layer 11A and the phase of the oscillation of the magnetization of the first ferromagnetic layer 11B are synchronized with each other, and the phase of the oscillation of the magnetization of the first ferromagnetic layer 11B and the phase of the oscillation of the magnetization of the first ferromagnetic layer 11C are deviated from each other by a half-wave length ($\pi$). When application of the current I to each of the spin orbit torque wirings 20 is stopped, the magnetization of the first ferromagnetic layer 11A and the magnetization of the first ferromagnetic layer 11B are parallel to each other, and the magnetization of the first ferromagnetic layer 11B and the magnetization of the first ferromagnetic layer 11C are anti-parallel to each other. In addition, the magnetization of the first ferromagnetic layer 11A and the magnetization of the first ferromagnetic layer 11C are anti-parallel to each other.

Orientation directions of the magnetizations of the first ferromagnetic layers 11A, 11B and 11C are output as resistance values of the first magnetoresistive effect element 10A, the second magnetoresistive effect element 10B and the third magnetoresistive effect element 10C. For example, signals of "0" from the first magnetoresistive effect element 10A, "0" from the second magnetoresistive effect element 10B and "1" from the third magnetoresistive effect element 10C are output.

As described above, the reservoir element 102 according to the third embodiment can compress the information by converting the oscillations of the plurality of first ferromagnetic layers 11 into the spin currents and causing the spin currents to interfere with each other in the spin-conductive layer 30. In addition, since the number of first ferromagnetic layers 11 is increased, interference between the signals from the first ferromagnetic layers 11 is complicated. Accordingly, the reservoir element 102 according to the third embodiment allows for more complex information processing. In addition, interference between the signals from the first ferromagnetic layers 11 can be read by the magnetoresistive effect elements 10.

Further, in the reservoir element 102 shown in FIG. 7, while three magnetoresistive effect elements 10 have been exemplarily shown, four or more magnetoresistive effect elements 10 may be arranged in the x-direction.

Fourth Embodiment

Figure 8:
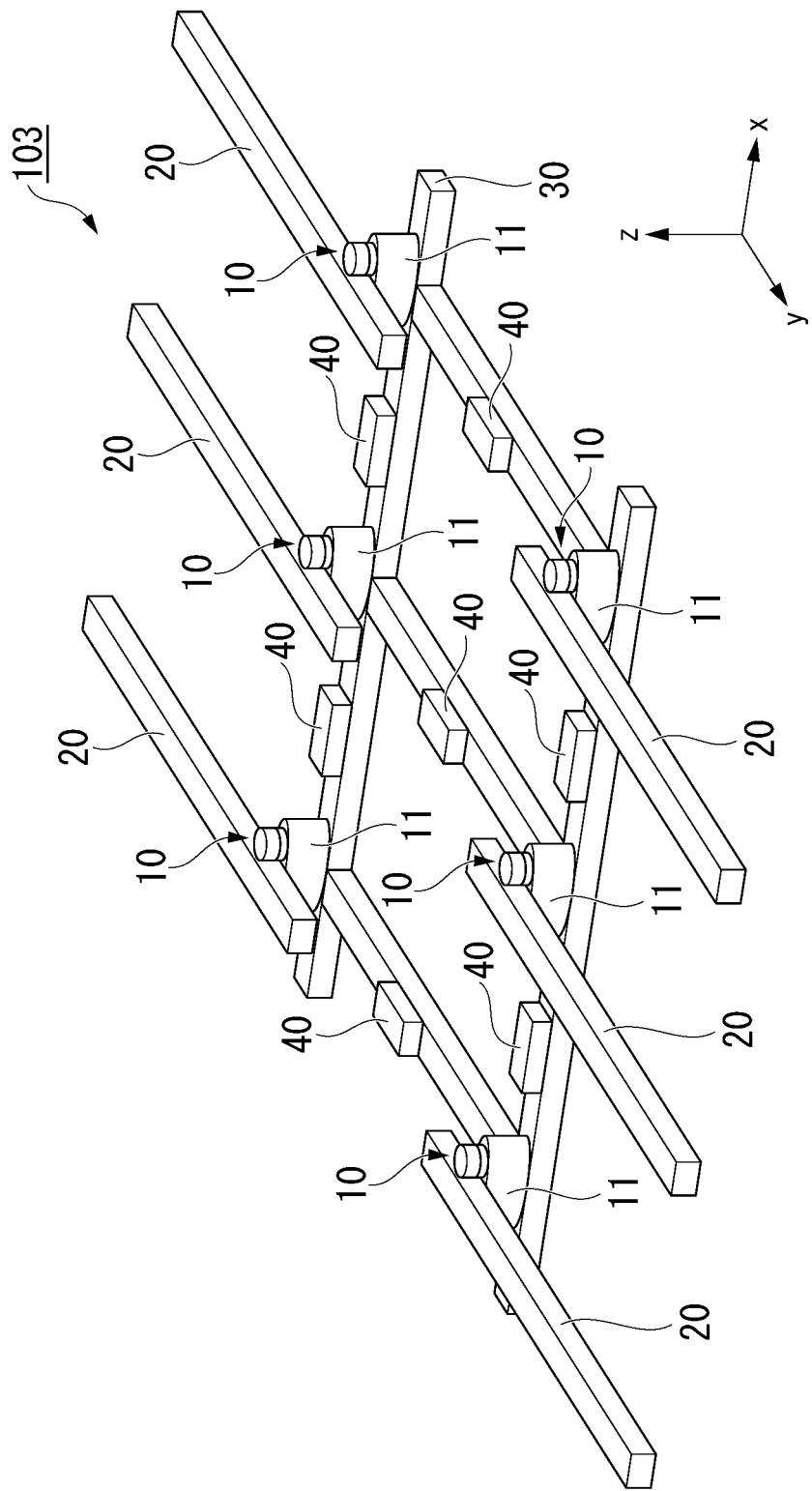
FIG. 8 is a perspective view of a reservoir element according to a fourth embodiment.

FIG. 8 is a perspective view of a reservoir element 103 according to a fourth embodiment. In the reservoir element 103, the number and disposition of magnetoresistive effect elements 10, the number of spin orbit torque wirings 20, a shape of the spin-conductive layer 30, and the number of gate electrodes 40 are different from those of the reservoir element 101 according to the second embodiment. The other configurations are the same as in the second embodiment and designated by the same reference signs. Description of the same configurations will be omitted.

The reservoir element 103 has the plurality of magnetoresistive effect elements 10, the plurality of spin orbit torque wirings 20, the spin-conductive layer 30 and the plurality of gate electrodes 40.

The plurality of magnetoresistive effect elements 10 are arranged two-dimensionally in the x-y plane perpendicular to the z-direction. In the specification, "arranged two-dimensionally" means that the plurality of magnetoresistive effect elements 10 are present on the same surface, and separate magnetoresistive effect elements are present on a line crossing a straight line that connects two arbitrary magnetoresistive effect elements. For example, when the plurality of magnetoresistive effect elements 10 are arranged in a square lattice shape or a hexagonal lattice shape when seen in plan view from the z-direction, it can be said that the plurality of magnetoresistive effect elements 10 are "arranged two-dimensionally."

The plurality of spin orbit torque wirings 20 are provided on each of the plurality of magnetoresistive effect elements 10.

The spin-conductive layer 30 has portions extending in the x-direction and portions extending in the y-direction, which form a lattice. For example, the plurality of magnetoresistive effect elements 10 are disposed at positions of intersections of the lattice of the spin-conductive layer 30. The spin-conductive layer 30 connects at least the two first ferromagnetic layers 11, which are closest to each other, of the plurality of first ferromagnetic layers 11.

The gate electrode 40 faces the spin-conductive layer 30. The gate electrode is disposed between the neighboring magnetoresistive effect elements 10 when seen in plan view from the z-direction.

The oscillations of the magnetizations of the neighboring first ferromagnetic layers 11 are converted into the spin currents and interfere with each other in the spin-conductive layer 30.

As described above, the reservoir element 103 according to the fourth embodiment can compress the information by converting the oscillations of the plurality of first ferromagnetic layers 11 into the spin currents and causing the spin currents to interfere with each other in the spin-conductive layer 30. In addition, since the number of the first ferromagnetic layers 11 is increased, interference between the signals from the first ferromagnetic layers 11 is complicated. Accordingly, the reservoir element 103 according to the fourth embodiment can process more complicated information. In addition, interference of the signals of the first ferromagnetic layers 11 can be read by the magnetoresistive effect elements 10.

Further, in the reservoir element 103 shown in FIG. 8, while the example in which the magnetoresistive effect elements 10 are disposed in two rows and three columns has been shown, disposition is not limited thereto.

Fifth Embodiment

Figure 9:
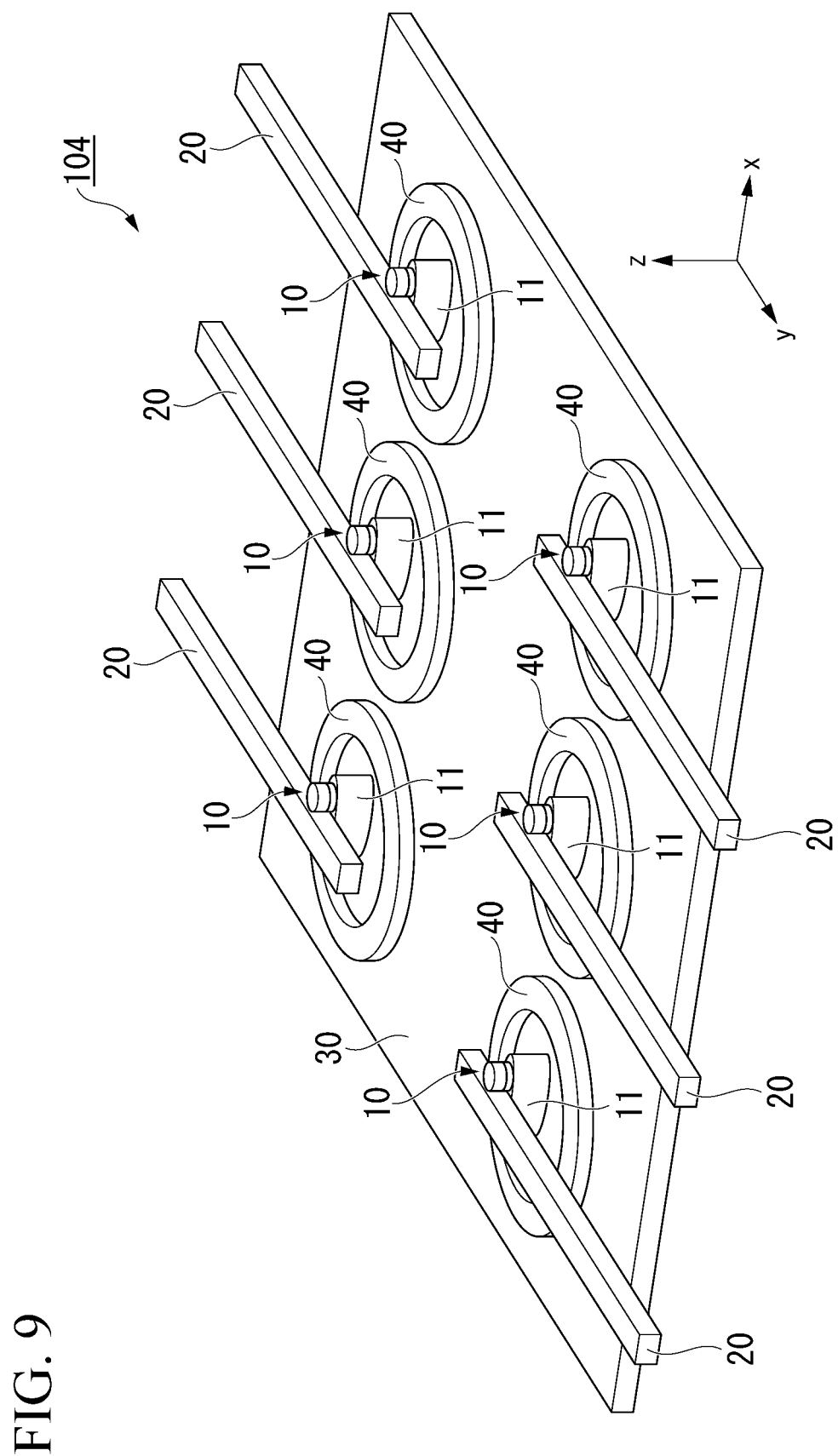
FIG. 9 is a perspective view of a reservoir element according to a fifth embodiment.

FIG. 9 is a perspective view of a reservoir element 104 according to a fifth embodiment. In the reservoir element 104, a shape of the spin-conductive layer 30 and a shape of the gate electrode 40 are different from those of the reservoir element 103 according to the fourth embodiment. The other configurations are the same as in the fourth embodiment and designated by the same reference signs. Description of the same configurations will be omitted.

The spin-conductive layer 30 is a plane extending in the x-y-direction. The spin-conductive layer 30 connects the plurality of first ferromagnetic layers 11.

The gate electrode 40 faces the spin-conductive layer 30. The gate electrode has an annular shape that surrounds the magnetoresistive effect elements 10.

As described above, the reservoir element 104 according to the fifth embodiment can compress the information by converting the oscillations of the plurality of first ferromagnetic layers 11 into the spin currents and causing the spin current to interfere with each other in the spin-conductive layer 30. In addition, since the spin-conductive layer 30 is a plane, interference between the first ferromagnetic layers 11 other than the neighboring first ferromagnetic layers 11 becomes easier.

Further, in the reservoir element 104 shown in FIG. 9, while the example in which the magnetoresistive effect elements 10 are disposed in two rows and three columns has been shown, disposition is not limited thereto.

Sixth Embodiment

Figure 10:
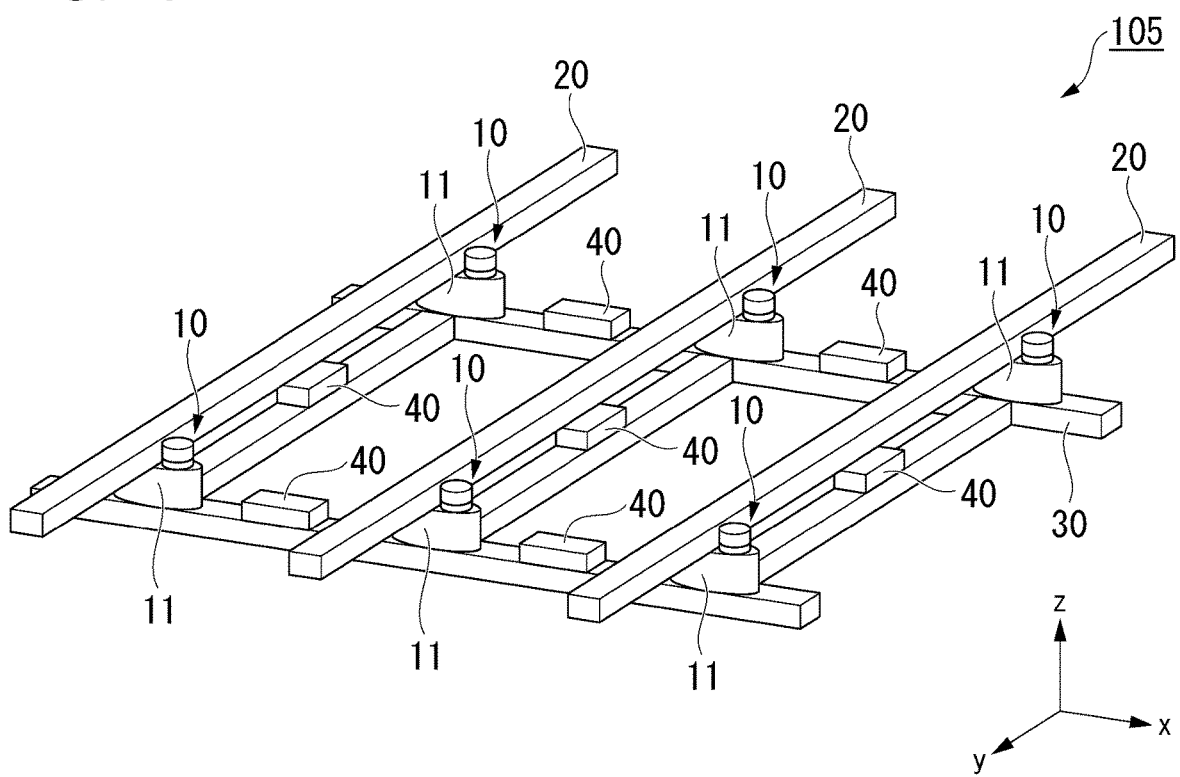
FIG. 10 is a perspective view of a reservoir element according to a sixth embodiment.

FIG. 10 is a perspective view of a reservoir element 105 according to a sixth embodiment. The reservoir element 105 is distinguished from the reservoir element 103 according to the fourth embodiment in that the spin orbit torque wiring 20 is connected to the plurality of first ferromagnetic layers 11. The other configurations are the same as in the fourth embodiment and designated by the same reference signs. Description of the same configurations will be omitted.

The spin orbit torque wiring 20 is connected to two or more first ferromagnetic layers 11 of the plurality of first ferromagnetic layers 11. The spin orbit torque wiring injects spins into the first ferromagnetic layer 11 and applies a spin orbit torque to the magnetization of the first ferromagnetic layer 11. The same spin orbit torque is applied to the first ferromagnetic layers 11 connected to the same spin orbit torque wiring 20. Accordingly, the first ferromagnetic layers 11 connected to the same spin orbit torque wiring 20 are easily resonated.

As described above, the reservoir element 105 according to the sixth embodiment can compress the information by converting the oscillations of the plurality of first ferromagnetic layers 11 into the spin currents and causing the spin currents to interfere with each other in the spin-conductive layer 30. In addition, since the spin orbit torque wiring 20 is connected to the plurality of first ferromagnetic layers 11, the first ferromagnetic layers 11 connected to the same spin orbit torque wiring 20 can easily interfere with each other.

Seventh Embodiment

Figure 11:
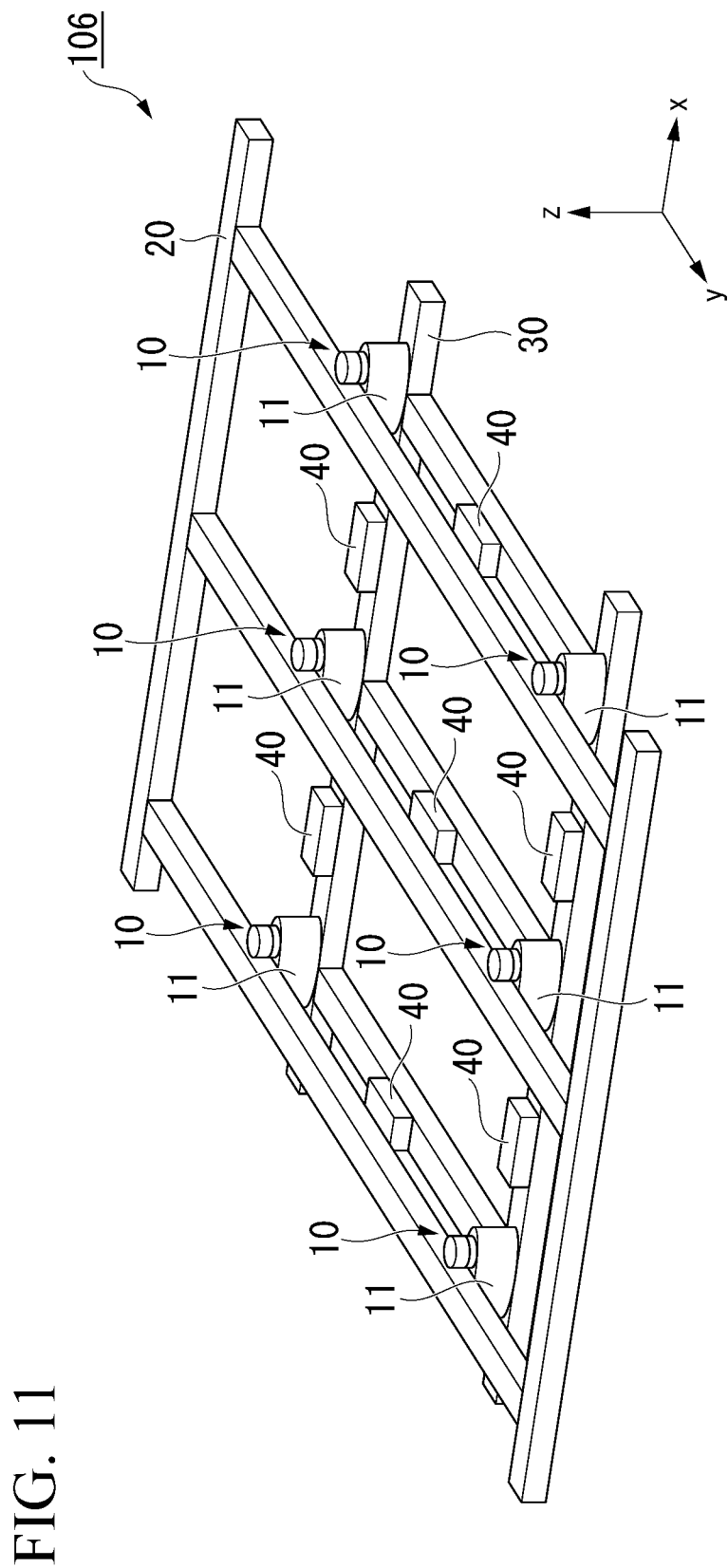
FIG. 11 is a perspective view of a reservoir element according to a seventh embodiment.

FIG. 11 is a perspective view of a reservoir element 106 according to a seventh embodiment. The reservoir element 106 is distinguished from the reservoir element 103 according to the fourth embodiment in that the spin orbit torque wiring 20 is connected to the plurality of first ferromagnetic layers 11. The other configurations are the same as in the fourth embodiment and designated by the same reference signs. Description of the same configurations will be omitted.

The spin orbit torque wiring 20 has portions extending in the x-direction and portions extending in the y-direction, which form a lattice. When the direction of the current flowing through the spin orbit torque wiring 20 and the lamination direction (the z-direction) of the first ferromagnetic layers 11 cross each other, the spins are injected into the first ferromagnetic layer 11. Since the spin orbit torque wiring 20 forms the lattice, the direction of the current flowing through the spin orbit torque wiring 20 and the lamination direction of the first ferromagnetic layers 11 cross each other.

The spin orbit torque wiring 20 is connected to all of the plurality of first ferromagnetic layers 11. The same spin orbit torque is applied to all of the first ferromagnetic layers 11. Accordingly, frequencies of the oscillations of the first ferromagnetic layers 11 coincide with each other, and the first ferromagnetic layers 11 are easily resonated.

As described above, the reservoir element 106 according to the seventh embodiment can compress the information by converting the oscillations of the plurality of first ferromagnetic layers 11 into the spin currents and causing the spin currents to interfere with each other in the spin-conductive layer 30. In addition, since the spin orbit torque wiring 20 is connected to the plurality of first ferromagnetic layers 11, the first ferromagnetic layers 11 connected to the same spin orbit torque wiring 20 can easily interfere with each other.

Eighth Embodiment

Figure 12:
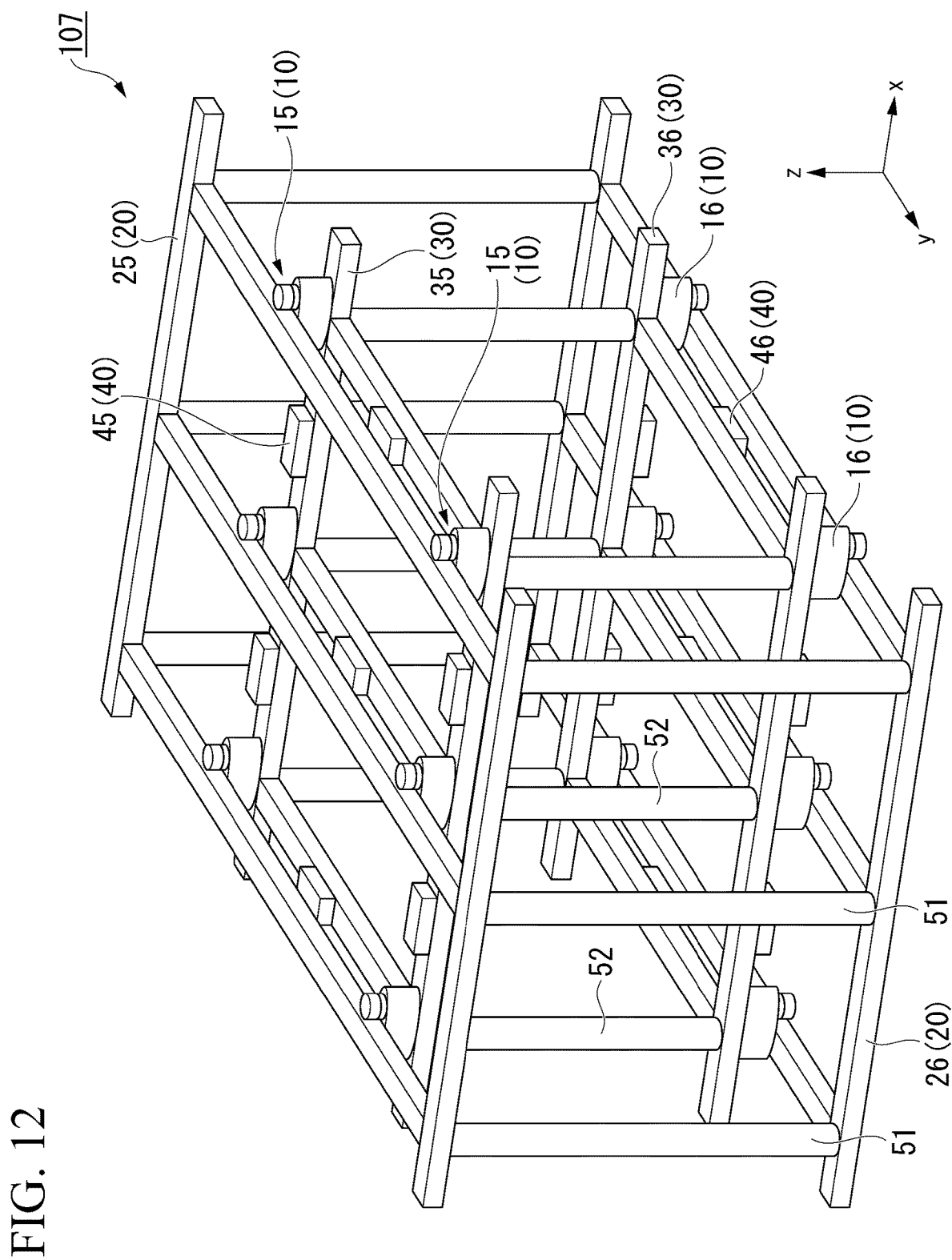
FIG. 12 is a perspective view of a reservoir element according to an eighth embodiment.

FIG. 12 is a perspective view of a reservoir element 107 according to an eighth embodiment. The reservoir element 107 is distinguished from the reservoir element 106 according to the seventh embodiment in that the spin orbit torque wiring 20, the magnetoresistive effect elements 10, the spin-conductive layer 30 and gate electrodes are arranged three-dimensionally. The other configurations are the same as in the seventh embodiment and designated by the same reference signs. Description of the same configurations will be omitted.

The reservoir element 107 has the plurality of magnetoresistive effect elements 10, the plurality of spin orbit torque wirings 20, the plurality of spin-conductive layers 30, the plurality of gate electrodes 40, a plurality of via wirings 51 and a plurality of spin via wirings 52.

The plurality of magnetoresistive effect elements 10 have a plurality of magnetoresistive effect elements 15 disposed at a first height position, and a plurality of magnetoresistive effect elements 16 disposed at a second height position. The height position shows a position in the z-direction. The plurality of magnetoresistive effect elements 15 are disposed on an x-y plane having the same height. The plurality of magnetoresistive effect elements 16 are disposed on the x-y plane having the same height.

The plurality of spin-conductive layers 30 have a first spin-conductive layer 35 and a second spin-conductive layer 36. The first spin-conductive layer 35 faces first ferromagnetic layers of the plurality of magnetoresistive effect elements 15 disposed at a first height position. The second spin-conductive layer 36 faces first ferromagnetic layers of the plurality of magnetoresistive effect elements 16 disposed at a second height position. The first spin-conductive layer 35 and the second spin-conductive layer 36 are disposed at different height positions.

The plurality of spin orbit torque wirings 20 have a first spin orbit torque wiring and a second spin orbit torque wiring 26. The first spin orbit torque wiring 25 faces first ferromagnetic layers of the plurality of magnetoresistive effect elements 15 disposed at a first height position. The second spin orbit torque wiring 26 faces first ferromagnetic layers of the plurality of magnetoresistive effect elements 16 disposed at a second height position. The first spin orbit torque wiring 25 and the second spin orbit torque wiring 26 are disposed at different height positions.

The plurality of gate electrodes 40 have a first gate electrode 45 and a second gate electrode 46. The first gate electrode 45 faces the first spin-conductive layer 35. The second gate electrode 46 faces the second spin-conductive layer 36. The first gate electrode 45 faces, for example, a +z surface of the first spin-conductive layer 35, and the second gate electrode 46 faces, for example, a −z surface of the second spin-conductive layer 36.

The plurality of via wirings 51 connect the first spin orbit torque wiring 25 and the second spin orbit torque wiring 26. The same current flows to the first spin orbit torque wiring 25 and the second spin orbit torque wiring 26 through the plurality of via wirings 51. The via wirings 51 are formed of the same material as that of the spin orbit torque wiring.

The plurality of spin via wirings 52 connect the first spin-conductive layer 35 and the second spin-conductive layer 36. The spin via wirings 52 conduct spins. The spin via wirings 52 are formed of the same material as that of the spin-conductive layer. The oscillations of the magnetizations of the magnetoresistive effect elements 15 and 16 disposed at the different height positions due to the spin via wirings 52 interfere with each other.

As described above, the reservoir element 107 according to the eighth embodiment can compress the information by converting the oscillations of the plurality of ferromagnetic layers into spin currents and causing the spin currents to interfere with each other in the spin-conductive layer 30. In addition, since the reservoir element 107 has a three-dimensional structure, it is possible to further improve assembly of the magnetoresistive effect elements 10.

Further, while the example in which the reservoir element 107 shown in FIG. 12 has the magnetoresistive effect elements 10 disposed at different height positions to form two layers has been shown, the magnetoresistive effect elements 10 may be disposed at two or more different height positions.

Hereinabove, while examples of the preferred embodiments of the present invention have been described in detail, the present invention is not limited to the embodiments and various modifications and changes may be made without departing from the scope of the present invention disclosed in the claims.

REFERENCE SIGNS LIST

10 Magnetoresistive effect element
10A First magnetoresistive effect element
10B Second magnetoresistive effect element
10C Third magnetoresistive effect element
11, 11A, 11B, 11C First ferromagnetic layer
12, 12A, 12B Second ferromagnetic layer
13, 13A, 13B Non-magnetic layer
20 Spin orbit torque wiring
21, 25 First spin orbit torque wiring
22, 26 Second spin orbit torque wiring
23 Third spin orbit torque wiring
30 Spin-conductive layer
31 Merging region
35 First spin-conductive layer
36 Second spin-conductive layer
40 Gate electrode
45 First gate electrode
46 Second gate electrode
51 Via wiring
52 Spin via wiring
100, 101, 102, 103, 104, 105, 106, 107 Reservoir element
110 Input part
120 Output part
200 Neuromorphic element
Cp Chip
$M_{11A}$, $M_{11B}$, $M_{12A}$, $M_{12B}$ Magnetization

What is claimed is:
1. A reservoir element, comprising:
a plurality of magnetoresistive effect elements each having a first ferromagnetic layer, a non-magnetic layer and a second ferromagnetic layer laminated in a first direction, and separated from each other;
a spin orbit torque wiring that faces a part of at least one of the plurality of magnetoresistive effect elements; and
a spin-conductive layer that connects at least the magnetoresistive effect elements closest to each other of the plurality of magnetoresistive effect elements, and conducts spins,
wherein, when the magnetoresistive effect elements are seen in plan view from the first direction, the second ferromagnetic layer overlaps a part of the first ferromagnetic layer,
the spin orbit torque wiring faces a first portion that does not overlap the second ferromagnetic layer in the first ferromagnetic layer when seen in plan view from the first direction, and
the spin-conductive layer faces at least the first ferromagnetic layer each of the closest magnetoresistive effect elements.

2. The reservoir element according to claim 1, further comprising a gate electrode facing the spin-conductive layer and disposed between the plurality of magnetoresistive effect elements.

3. The reservoir element according to claim 1, wherein a plurality of the spin orbit torque wirings are provided, and
each of the plurality of spin orbit torque wirings are connected to each of the first ferromagnetic layers.

4. The reservoir element according to claim 1, wherein the spin orbit torque wiring is connected to two or more first ferromagnetic layers of a plurality of first ferromagnetic layers.

5. The reservoir element according to claim 1, wherein the plurality of magnetoresistive effect elements are disposed in a one-dimensional array on a first surface crossing the first direction.

6. The reservoir element according to claim 1, wherein the plurality of magnetoresistive effect elements are disposed in a two-dimensional array on a first surface crossing the first direction.

7. The reservoir element according to claim 6, wherein the spin-conductive layer form a lattice, and
the magnetoresistive effect elements face positions of intersections of the lattice of the spin-conductive layer.

8. The reservoir element according to claim 1, wherein a plurality of the spin-conductive layers are provided,
a first spin-conductive layer faces the first ferromagnetic layer of a magnetoresistive effect element disposed at a first height position in the first direction,
a second spin-conductive layer faces the first ferromagnetic layer of a magnetoresistive effect element disposed at a second height position in the first direction, and
the first spin-conductive layer and the second spin-conductive layer are connected to each other by a spin via wiring that conducts spins.

9. The reservoir element according to claim 1, wherein the spin-conductive layer includes any one metal or an alloy selected from the group consisting of Cu, Ag, Al, Mg, and Zn.

10. The reservoir element according to claim 1, wherein the spin-conductive layer includes any one element or compound selected from the group consisting of Si, Ge, GaAs, and C.

11. A neuromorphic element, comprising:
the reservoir element according to claim 1;
an input part connected to the reservoir element; and
an output part connected to the reservoir element and configured to learn a signal from the reservoir element.

* * * * *